(12) United States Patent
Dayley et al.

(10) Patent No.: US 10,852,757 B2
(45) Date of Patent: *Dec. 1, 2020

(54) LOW-POWER, HIGH-PERFORMANCE REGULATOR DEVICES, SYSTEMS, AND ASSOCIATED METHODS

(71) Applicant: Intel Corporation, Santa Clara, CA (US)

(72) Inventors: Matthew Dayley, Plymouth, CA (US); Liyao Miao, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/017,415

(22) Filed: Jun. 25, 2018

(65) Prior Publication Data

US 2019/0025864 A1 Jan. 24, 2019

Related U.S. Application Data

(63) Continuation of application No. 14/754,543, filed on Jun. 29, 2015, now Pat. No. 10,031,538.

(51) Int. Cl.
*G05F 1/575* (2006.01)
*G05F 1/46* (2006.01)
(Continued)

(52) U.S. Cl.
CPC .............. *G05F 1/575* (2013.01); *G05F 1/468* (2013.01); *H03F 3/45076* (2013.01); *G05F 1/461* (2013.01); *G05F 1/563* (2013.01); *H03F 2203/45116* (2013.01); *H03F 2203/45336* (2013.01)

(58) Field of Classification Search
CPC ... G05F 3/30; G05F 3/20; G05F 3/205; G05F 3/24; G05F 3/222; G05F 3/242; G05F 3/225; G05F 3/227; G05F 3/245; G05F 3/247; G05F 3/26; G05F 3/262; (Continued)

(56) References Cited

U.S. PATENT DOCUMENTS 7,825,639 B1  11/2010 Suzuki et al.
2004/0070440 A1* 4/2004 Tang ........................ G05F 3/205
                                                              327/534

(Continued)

OTHER PUBLICATIONS https://www.electronics-tutorials.ws/systems/feedback-systems.html (Year: 2014).*

(Continued)

*Primary Examiner* — Bryan R Perez
(74) *Attorney, Agent, or Firm* — Compass IP Law PC

(57) ABSTRACT

Low-power, high-performance voltage regulator circuit devices are disclosed and described. In one embodiment, such a device can include a first stage circuitry configured to generate a high voltage reference from a low voltage reference, a second stage circuitry coupled to the first stage circuitry, the second stage circuitry configured to receive the high voltage reference and output a voltage regulated signal, and a switch disposed between and coupled to the first stage circuitry and the second stage circuitry, the switch being configured to couple and uncouple the first stage circuitry from the second stage circuitry.

19 Claims, 6 Drawing Sheets

(51) Int. Cl.
*H03F 3/45* (2006.01)
*G05F 1/563* (2006.01)

(58) Field of Classification Search
CPC . G05F 3/265; G05F 3/267; G05F 3/10; G05F 3/16
See application file for complete search history.

(56) References Cited

U.S. PATENT DOCUMENTS

| | | | |
|---|---|---|---|
| 2006/0108993 A1 | 5/2006 | Chien et al. | |
| 2007/0242536 A1* | 10/2007 | Matsubara | G11C 5/144 365/189.09 |
| 2010/0244908 A1* | 9/2010 | Miyatake | G11C 5/147 327/109 |
| 2013/0049724 A1 | 2/2013 | Kung et al. | |

OTHER PUBLICATIONS

Carter, Bruce et al.; SBOA092A Application Report; Handbook of Operational Amplifier Applications; Texas Instruments; Oct. 1, 2001, 94 pages.
Final Office Action for U.S. Appl. No. 14/754,543, dated Sep. 11, 2017, 17 pages.
International Search Report and Written Opinion for PCT Patent Application No. PCT/US16/34872, dated Aug. 30, 2016, 16 pages.
Office Action for U.S. Appl. No. 14/754,543, dated Mar. 7, 2017, 16 pages.
Taiwanese and English Translation of Search Report of R.O.C. for Patent Application No. 105114313, dated Jun. 6, 2019, 2 pages.
Chinese and English of P.R. China State Intellectual Property Office First Office Action for Patent Application No. 201680020148.7, dated Jun. 12, 2019, 10 pages.
German Examination Report for Patent Application No. 102016109648.2, dated Mar. 1, 2019, 10 pages.
U. Tietze et al. Electronic Circuits, Springer 2008, Chapter 5: Operational Amplifiers pp. 483-586.
Chinese Second Office Action of P.R. China State Intellectual Property Office for Patent Application No. 201680030148.7, dated Jan. 19, 2020, 9 pages.
Chinese First Office Action of P.R. China State Intellectual Property Office for Patent Application No. 201910030849.6, dated Jan. 15, 2020, 11 pages.
German and English Translation of German Final Office Action/Refusal for Patent Application No. 102016109648.2, dated Aug. 9, 2019, 8 pages.
Tietzee, U.; Schenk, C ., Semiconductor Circuit Technology, 11th edition, Berlin, Heidelberg, New York; Springer, 1999, pp. 487-488, ISBN 3-540-64192-0.
Bruce-Carter et al: "Handbook of Operational Amplifier Applications", Oct. 1, 2001.
European Office Action for Patent Application No. 16729150.9, dated Aug. 7, 2020, 10 pages.

* cited by examiner

LOW-POWER, HIGH-PERFORMANCE REGULATOR DEVICES, SYSTEMS, AND ASSOCIATED METHODS

PRIORITY DATA

This application is a continuation of U.S. patent application Ser. No. 14/754,543, filed on Jun. 29, 2015, which is incorporated herein by reference in its entirety.

BACKGROUND

A voltage regulator is an electronic element designed to automatically maintain a constant voltage level. A voltage regulator may be a simple "feed-forward" design or may include negative feedback control loops. Such devices can utilize electromechanical mechanisms or electronic components. Feedback voltage regulators operate by comparing the output voltage to some fixed reference voltage. A difference is amplified and used to control the regulation element in such a way as to reduce the voltage differential. This forms a negative feedback control loop, where increasing the open-loop gain tends to increase regulation accuracy but reduce stability.

DESCRIPTION OF EMBODIMENTS

Figure 1:
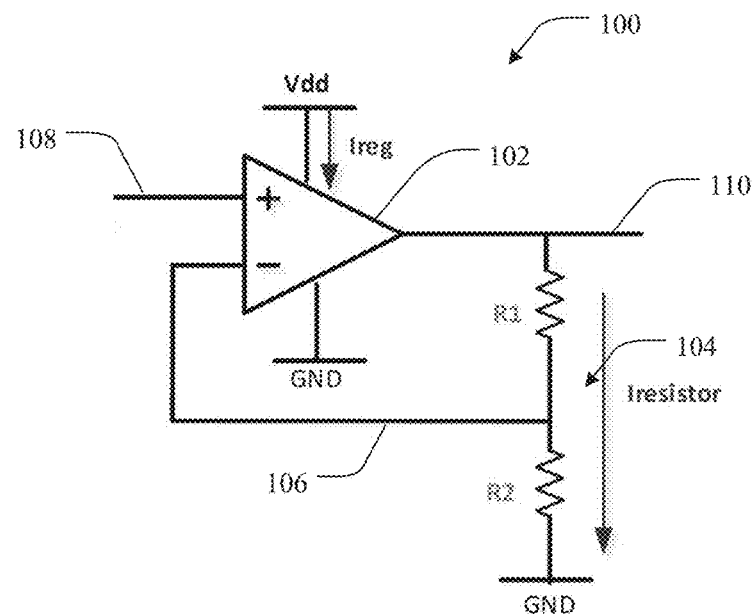
FIG. 1 is a schematic view of a regulator device.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in the specification, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects or structures described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example," or "in an embodiment, or "in an aspect," in various places throughout this specification do not necessarily all refer to the same example, embodiment, or aspect.

Example Embodiments

An initial overview of technology embodiments is provided below and specific technology embodiments are then described in further detail. This initial summary is intended to aid readers in understanding the technology more quickly but is not intended to identify key or essential technological features, nor is it intended to limit the scope of the claimed subject matter.

Traditional regulator designs typically use resistive feedback to convert a low voltage reference to a high voltage supply. A tradeoff exists, however, between power and performance of such a regulator, because a high resistance feedback ladder gives low power, but also causes performance degradation. On the other hand, a low resistance ladder leads to higher performance but has a high standby power requirement.

FIG. 1 shows a design for a traditional voltage regulator 100, having an operational amplifier (op-amp) 102, a resistance ladder 104 (i.e. voltage divider), and a feedback loop 106 from the resistance ladder 104 to the inverting input of the op-amp 102. A reference voltage input 108 is electrically coupled to the non-inverting input of the op-amp 102. By this design, the reference voltage from the reference voltage input 108 is stepped up to a voltage that is dependent on the resistance of the resistance ladder 104. The higher the resistance, the higher the voltage of the regulated voltage output 110. As has been described, however, the high resistance of the resistance ladder 104 introduces an extra delay into the feedback loop 106, thus reducing performance.

The inventors have discovered that a high-performance, low-power regulator can be realized by utilizing a two-stage design that separates the reference generation from the regulator performance. The first stage of the regulator receives a low voltage reference input and generates a high voltage reference. The second stage receives the high voltage reference and generates a voltage regulated signal at a unity gain. Such a unity gain design thus provides a low-power, high-performance regulator having minimal background current. In some cases, a switch is disposed between and coupled to the first stage and the second stage, and the switch can be utilized or configured to couple and uncouple the first stage from the second stage.

By operating the first stage in a gated or sample mode where the on-time of the first stage is limited, the power requirements for generating the high voltage reference are greatly reduced. The degree of power reduction can vary depending on the design and intended use of the regulator. The power usage of the first stage will vary as a function of the time the first stage is on. In other words, the power usage varies as a function of the duty cycle of the first stage. Any range of duty cycles can be used, depending on the desired energy reduction of the regulator. In some cases the duty cycle of the first stage can be the minimum duty cycle necessary to refresh the high voltage input to the second stage at a rate sufficient to maintain the voltage regulated signal. In some cases, the duty cycle can be less than or equal to 50%, 25%, 10%, or 5%. In one specific example, the duty cycle of the first stage can be less than or equal to 5%. In another specific example, the duty cycle of the first stage can be less than or equal to 1%.

The architecture of a given stage can vary, and can depend on a variety of design choices. The present scope includes any circuitry configuration in which a first stage generates a high voltage reference from a low voltage input and a second stage holds the high voltage reference and outputs a voltage regulated signal at a unity gain, even when the first stage is switched off or otherwise uncoupled from the second stage.

Figure 2A:
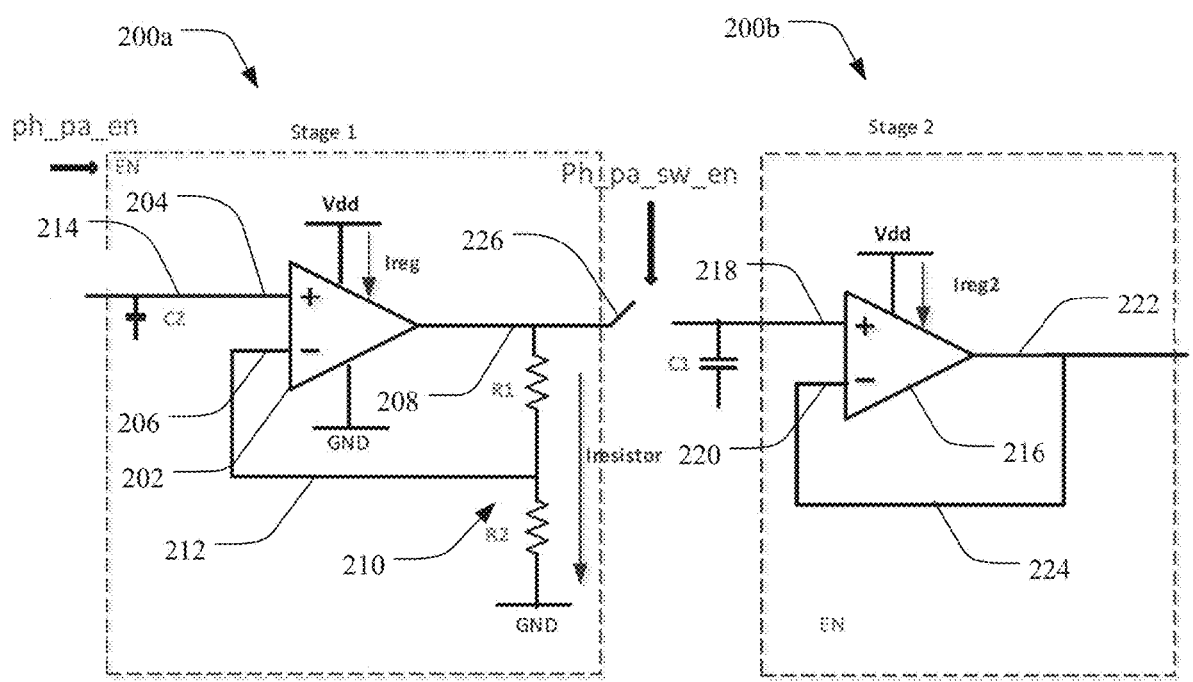
FIG. 2a is a schematic view of regulator device in accordance with an invention embodiment.

In one positive regulator design, for example, a low-power, high-performance voltage regulator circuit device is provided, as is shown in FIG. 2a. Such a device can include a first stage 200a, which includes a first op-amp 202 having a first non-inverting input 204 (positive input), a first inverting input 206 (negative input), and a first output 208. A high resistance feedback circuitry 210 is coupled across the first output 208 and the first inverting input 206 to form a high resistance feedback loop 212. In some examples the high resistance feedback circuitry can be a resistor ladder, a voltage divider, or any other circuit element capable of stepping up the voltage of a low voltage reference. Additionally, voltage reference input circuitry 214 is coupled to the first non-inverting input 204 of the first op-amp 202.

The second stage 200b can include a second op-amp 216 having a second non-inverting input 218 (positive input), a second inverting input 220 (negative input), and a second output 222. The first output 208 of the first op-amp 202 is coupled to the second non-inverting input 218 of the second op-amp 216. Additionally, low resistance feedback circuitry 224 is coupled across the second output 222 and the second inverting input 220. As is also shown in FIG. 2a, a switch 226 is coupled between the first output 208 of the first op-amp 202 and the second inverting input 218 of the second op-amp 216. The switch 226 can be any switching element operable to disconnect the first op-amp 202 from the second op-amp 216.

In operation, a low voltage input or reference is applied to the first non-inverting input 204 of the first op-amp 202. Any useful low voltage reference can be utilized, depending on various device and system designs. In one example, the low voltage reference can be the bandgap reference (vbandgap) commonly used in the arts. The low voltage reference is stepped up to a high voltage reference as a function of the resistance of the high resistance feedback circuitry 210 and the feedback loop 212, and communicated in a gated or sampling fashion to the second non-inverting input 218 of the second op-amp 216. The second non-inverting input 218 is charged to an appropriate voltage according to the high voltage reference. In some examples the second non-inverting input 218 is charged to the same voltage as the high voltage reference. Once valid, the switch 226 can be opened to decouple the first stage from the second stage and the high voltage reference can be maintained at the second stage. The first stage 200a can be placed in a low power or off state pending the next sampling event, and the second non-inverting input is maintained at the reference voltage while the first stage and second stage are uncoupled. For the next sampling event, the first op-amp is turned on to generate the high voltage reference, and the switch is closed to couple the first and second stages, where the second non-inverting input is again charged with the high voltage reference. Utilizing such a "sleep" state can thus greatly reduce power consumption of the regulator device.

The design of the second stage 200b includes a low resistance feedback loop 224 from the second output 222 to the second inverting input 220 of the second op-amp 216. This low resistance pathway design allows a unity gain or nearly unity gain output of a voltage regulated signal at the second output 222. The lack of a high resistance feedback circuit between the second output 222 and the second inverting input 220 eliminates or greatly reduces many of the performance issues seen with high resistance feedback designs in traditional regulators. Also, because the second stage is operating in a sample and hold mode, where the high voltage reference is sampled during the on-times of the first stage, the device power usage is greatly decreased during hold times between samplings. Such a sample and hold scheme results in an overall reduction in power usage of the device, and potentially across a system incorporating such a regulator device.

Figure 2B:
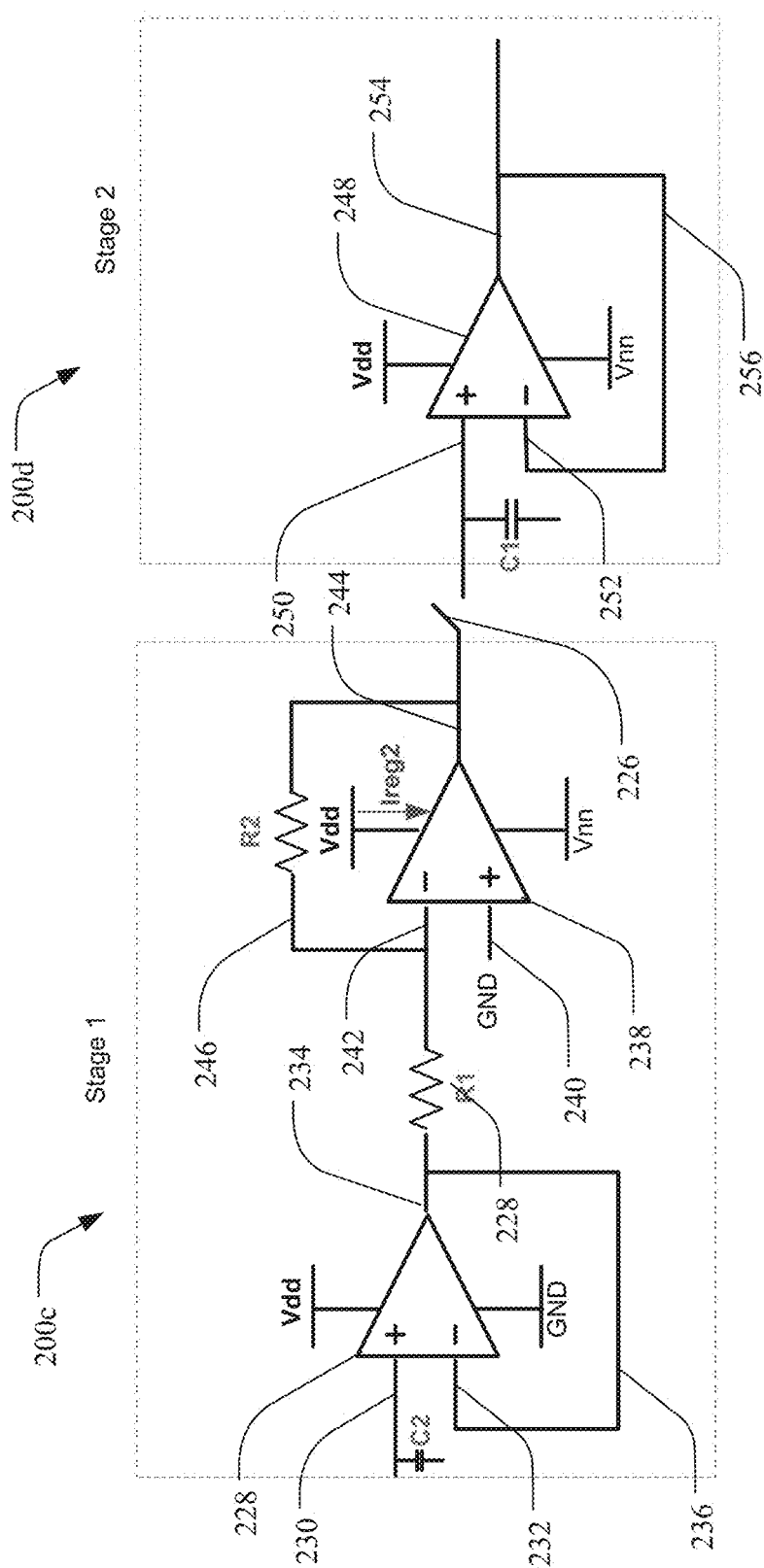
FIG. 2b is a schematic view of regulator device in accordance with an invention embodiment.

FIG. 2b shows an exemplary design for a negative regulator circuit. Such a design can include a first stage 200c having first stage circuitry including a primary op-amp 228 having a primary non-inverting input 230, a primary inverting input 232, and a primary output 234, feedback circuitry 236 coupled across the primary output 234 and the primary inverting input 232, and voltage reference input circuitry coupled to the primary non-inverting input 230. The first stage 200c also includes a secondary op-amp 238 having a secondary non-inverting input 240, a secondary inverting input 242, and a secondary output 244, where the primary output 234 is coupled to the secondary inverting input 242, and high resistance feedback circuitry 246 coupled across the secondary output 244 and the secondary inverting input 242. Furthermore, in some cases the primary output 234 is coupled to the secondary inverting input 242 with high resistance circuitry 258.

The second stage 200d includes second stage circuitry comprising a tertiary op-amp 248 having a tertiary non-inverting input 250, a tertiary inverting input 252, and a tertiary output 254, where the secondary output 244 is coupled to the tertiary non-inverting input 250, and low resistance feedback circuitry 256 coupled across the tertiary output 254 and the tertiary inverting input 252. In some examples, the second stage circuitry generates a unity gain output.

Figure 3:
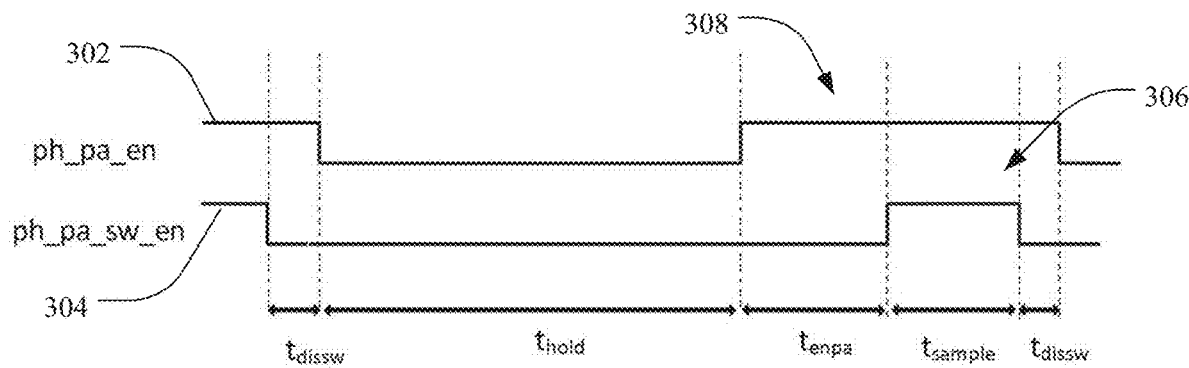
FIG. 3 is a representation of a timing diagram in accordance with an invention embodiment.

FIG. 3 shows an exemplary timing diagram for the first stage 302 and the second stage 304 of the regulator device. The high state for the first stage 308 represents the on-time of the first stage, while the low state represents the off-time of the first stage. The high state of the second stage 306 represents the sampling or charging time ($t_{sample}$) of the op-amp in the second stage, which coincides with the on-time of the first stage 302.

Figure 4:
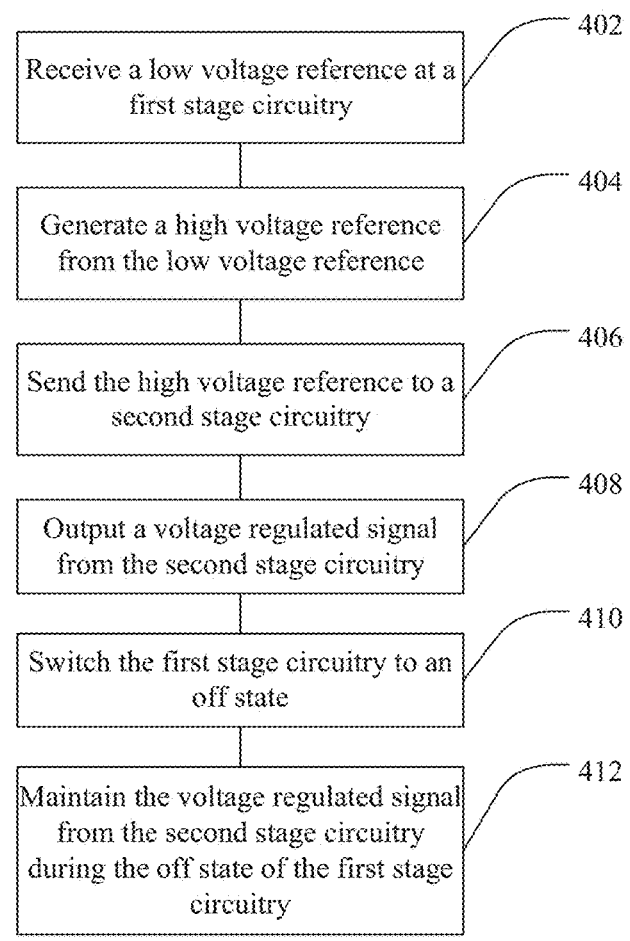
FIG. 4 is a depiction of circuitry operations of a regulator device in accordance with an invention embodiment.

In another example, a low-power, high-performance voltage regulator device is provided. As is shown in FIG. 4, the voltage regulator includes circuitry configured to 402 receive a low voltage reference at a first stage circuitry, 404 generate a high voltage reference from the low voltage reference, 406 send the high voltage reference to a second stage circuitry, 408 output a voltage regulated signal from the second stage circuitry, 410 switch the first stage circuitry to an off state, and 412 maintain the voltage regulated signal from the second stage circuitry during the off state of the first stage circuitry.

In some examples, the circuitry can further be configured to switch the first op-amp to an on state and regenerate the high voltage reference from the low voltage reference. The high voltage reference can then be resent to the second input of the second op-amp and the first op-amp can be switched to the off state. In yet another example, the voltage regulated signal can be maintained from the second op-amp for the duration of the off state of the first op-amp.

Figure 5:
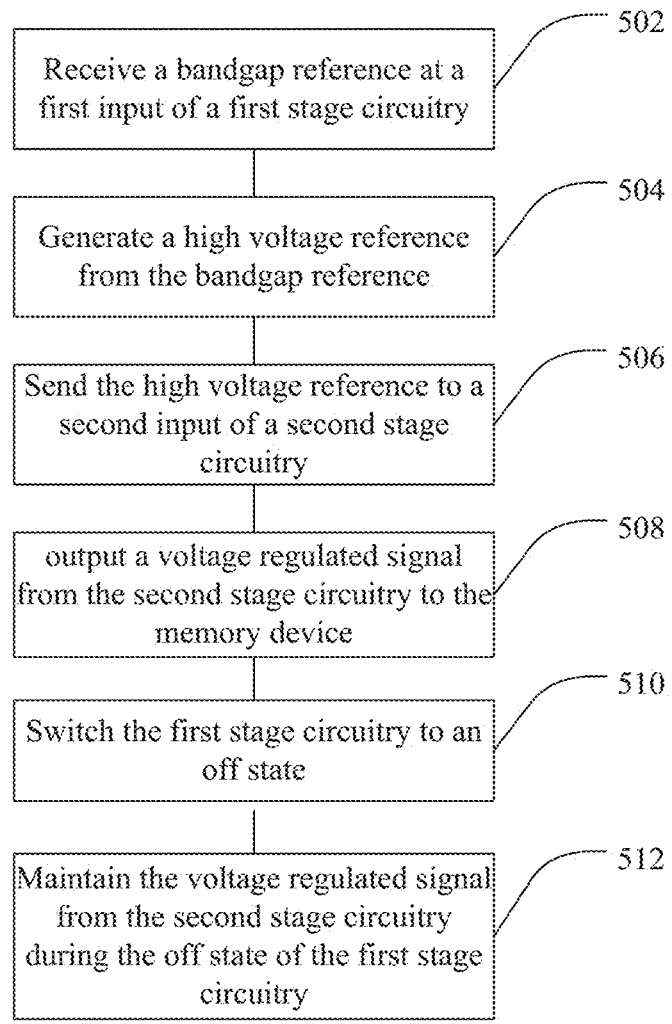
FIG. 5 is a depiction of circuitry operations of a regulator device in accordance with an invention embodiment.

In yet another example, an apparatus of a memory device for providing a low-power high-performance voltage regulated reference signal to the memory device is provided. Referring to FIG. 5, the device can include circuitry that is configured to 502 receive a bandgap reference at a first stage circuitry, and 504 generate a high voltage reference from the bandgap reference. The circuitry is also configured to 506 send the high voltage reference to a second stage circuitry, 508 output a voltage regulated signal from the second stage circuitry to the memory device, 510 switch the first stage circuitry to an off state, and 512 maintain the voltage regulated signal from the second stage circuitry during the off state of the first stage circuitry.

In some examples, the circuitry can further be configured to switch the first op-amp to an on state, regenerate the high voltage reference from the bandgap reference, resend the high voltage reference to the second input of the second op-amp, and switch the first op-amp to the off state. In yet other examples, the circuitry can be further configured to switch the first op-amp to an on state, regenerate the high voltage reference from the bandgap reference, resend the high voltage reference to the second input of the second op-amp by coupling the output of the first op-amp to the non-inverting input of second op-amp, wait for "resend" to complete, then decouple the output of the first op-amp and the non-inverting input of second op-amp, and switch the first op-amp to the off state. When the first op-amp is in an off state, the voltage regulated signal from the second op-amp is maintained because the output of the first stage and input of the second stage are decoupled.

The voltage regulated signal can be utilized for a variety of uses in a memory device, and any such use is considered to be within the scope of the present disclosure. For example, a voltage regulated signal can be applied across a memory cell in order to change the cell state from a 0 to a 1 (i.e. a write operation). In another example, a voltage regulated signal can be applied across a memory cell in order to determine if the cell is in a 0 or 1 state (i.e. a read operation). In yet another example, a voltage regulated signal can be used as a power rail for circuitry used in the memory device, such as, for example, sensing circuits, address decode, combinational logic, and the like.

Additionally, it is contemplated that the present regulator technology can be utilized with various electronic devices and components, all of which are considered to be within the present scope. Non-limiting examples can include ICs, CPUs, GPUs, memory devices, imagers, CMOS circuitry, and the like. In one example, the electronic device can be a memory device. Any memory device into which the present regulator technology can be incorporated is considered to be within the present scope. In one example the memory device is a phase change memory device.

Figure 6:
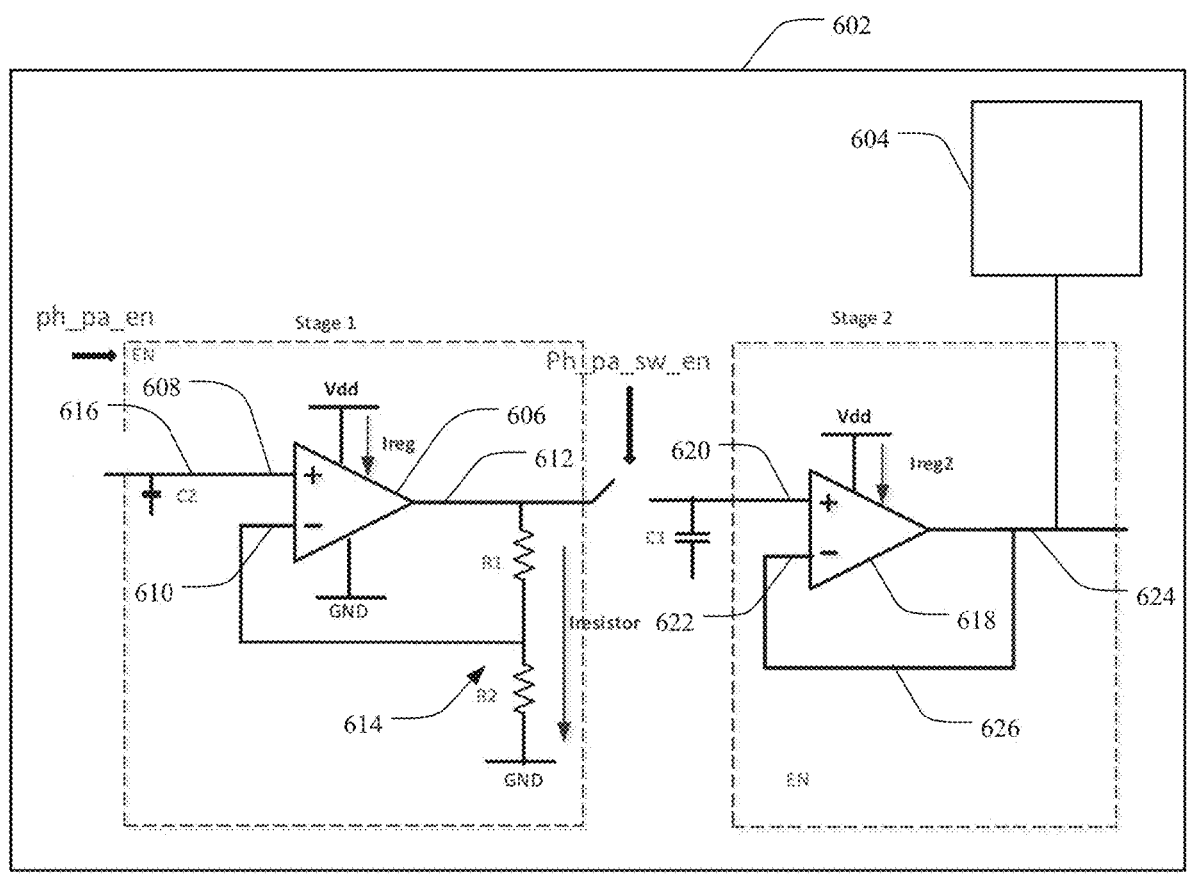
FIG. 6 is a schematic view of memory device in accordance with an invention embodiment.

In another example, as is shown in FIG. 6, a memory device 602 is provided having a non-transitory machine readable storage medium 604 and a first op-amp 606 having a first non-inverting input 608, a first inverting input 610, and a first output 612. The device includes high resistance feedback circuitry 614 coupled across the first output 612 and the first inverting input 610, and voltage reference input circuitry 616 coupled to the first non-inverting input 608. Furthermore, the device includes a second op-amp 618 having a second non-inverting input 620, a second inverting input 622, and a second output 624, where the first output 612 is coupled to the second non-inverting input 620, and the second output 624 is coupled to the storage medium 604. Low resistance feedback circuitry 626 is coupled across the second output 624 and the second inverting input 622. A similar design is contemplated for negative regulator circuit designs, as well as any other circuit design capable of achieving the regulated output described.

Figure 7:
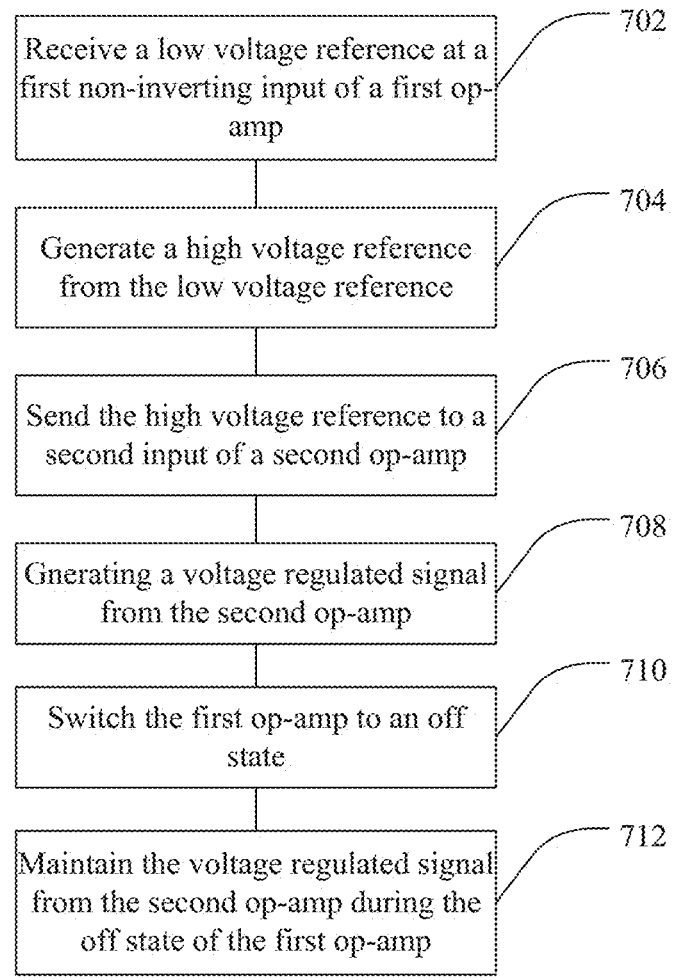
FIG. 7 is a depiction of a method of generating a low-power high-performance voltage regulated signal from a voltage regulator circuit in accordance with an invention embodiment.

In yet another example, a method of generating a low-power high-performance voltage regulated signal from a voltage regulator circuit is provided. As is shown in FIG. 7, such a method can include 702 receiving a low voltage reference at a first stage circuitry, 704 generating a high voltage reference from the low voltage reference across a voltage divider in the first stage circuitry, 706 sending the high voltage reference to a second stage circuitry, 708 generating a voltage regulated signal across a low resistance circuit in the second stage circuitry, 710 switching the first stage circuitry to an off state; and 712 maintaining the voltage regulated signal from the second stage circuitry during the off state of the first stage circuitry.

In another example, a non-transitory machine readable storage medium having instructions embodied thereon for generating a low-power high-performance voltage regulated signal is provided. The instructions when executed can perform the following: receiving, using a first stage circuitry, a low voltage reference, generating, using the stage circuitry, a high voltage reference from the low voltage reference, sending, to a second stage circuitry, the high voltage reference, generating, using the second stage circuitry, a voltage regulated signal, switching the first stage circuitry to an off state, and maintaining the voltage regulated signal from the second stage circuitry during the off state of the first stage circuitry.

In another example, the instructions when executed can further perform the following: switching the first stage circuitry to an on state, regenerating, the first stage circuitry, the high voltage reference from the low voltage reference, resending, to the second stage circuitry, the high voltage reference, and switching the first stage circuitry to the off state.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. The node and wireless device can also include a transceiver module (i.e., transceiver), a counter module (i.e., counter), a processing module (i.e., processor), and/or a clock module (i.e., clock) or timer module (i.e., timer). One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

Examples

In one example, a voltage regulator circuit device is provided, comprising:

first stage circuitry configured to generate a high voltage reference from a low voltage reference;

second stage circuitry coupled to the first stage circuitry, the second stage circuitry configured to receive the high voltage reference and output a voltage regulated signal; and a switch disposed between and coupled to the first stage circuitry and the second stage circuitry, the switch being configured to couple and uncouple the first stage circuitry from the second stage circuitry.

In another example, the first stage circuitry further comprises:

a primary operational amplifier (op-amp) having a primary non-inverting input, a primary inverting input, and a primary output;

feedback circuitry coupled across the primary output and the primary inverting input;

voltage reference input circuitry coupled to the primary non-inverting input;

a secondary op-amp having a secondary non-inverting input, a secondary inverting input, and a secondary output, wherein the primary output is coupled to the secondary inverting input; and high resistance feedback circuitry coupled across the secondary output and the secondary inverting input; and wherein the second stage circuitry further comprises:

a tertiary op-amp having a tertiary non-inverting input, a tertiary inverting input, and a tertiary output, wherein the secondary output is coupled to the tertiary non-inverting input; and low resistance feedback circuitry coupled across the tertiary output and the tertiary inverting input.

In another example, the primary output is coupled to the secondary inverting input with high resistance circuitry.

In another example, the first stage circuitry further comprises:

a first operational amplifier (op-amp) having a first non-inverting input, a first inverting input, and a first output;

high resistance feedback circuitry coupled across the first output and the first inverting input;

voltage reference input circuitry coupled to the first non-inverting input; and wherein the second stage circuitry further comprises:

a second op-amp having a second non-inverting input, a second inverting input, and a second output, wherein the first output is coupled to the second non-inverting input; and low resistance feedback circuitry coupled across the second output and the second inverting input.

In another example, the second stage circuitry is a unity gain buffer.

In another example, the first stage circuitry includes a voltage reference input coupled to a voltage reference source.

In another example, the voltage reference source is a bandgap reference source.

In another example, a memory device is provided, comprising:

a non-transitory machine readable storage medium;

first stage circuitry configured to generate a high voltage reference from a low voltage reference;

second stage circuitry coupled to the first stage circuitry and to the non-transitory machine readable storage medium, the second stage circuitry configured to receive the high voltage reference and output a voltage regulated signal to the non-transitory machine readable storage medium; and a switch disposed between and coupled to the first stage circuitry and the second stage circuitry, the switch being configured to couple and uncouple the first stage circuitry from the second stage circuitry.

In another example, the first stage circuitry further comprises:

a primary operational amplifier (op-amp) having a primary non-inverting input, a primary inverting input, and a primary output;

feedback circuitry coupled across the primary output and the primary inverting input;

voltage reference input circuitry coupled to the primary non-inverting input;

a secondary op-amp having a secondary non-inverting input, a secondary inverting input, and a secondary output, wherein the primary output is coupled to the secondary inverting input; and high resistance feedback circuitry coupled across the secondary output and the secondary inverting input; and wherein the second stage circuitry further comprises:

a tertiary op-amp having a tertiary non-inverting input, a tertiary inverting input, and a tertiary output, wherein the secondary output is coupled to the tertiary non-inverting input; and low resistance feedback circuitry coupled across the tertiary output and the tertiary inverting input.

In another example, the primary output is coupled to the secondary inverting input with high resistance circuitry.

In another example, the first stage circuitry further comprises:

a first operational amplifier (op-amp) having a first non-inverting input, a first inverting input, and a first output;

high resistance feedback circuitry coupled across the first output and the first inverting input;

voltage reference input circuitry coupled to the first non-inverting input; and wherein the second stage circuitry further comprises:

a second op-amp having a second non-inverting input, a second inverting input, and a second output, wherein the first output is coupled to the second non-inverting input; and low resistance feedback circuitry coupled across the second output and the second inverting input.

In another example, the second stage circuitry is a unity gain buffer.

In another example, the first stage circuitry includes a voltage reference input coupled to a voltage reference source.

In another example, the voltage reference source is a bandgap reference source.

In another example, a low-power high-performance voltage regulator device is provided having circuitry configured to:

receive a low voltage reference at a first stage circuitry;

generate a high voltage reference from the low voltage reference;

send the high voltage reference to a second stage circuitry;

output a voltage regulated signal from the second stage circuitry;

switch the first stage circuitry to an off state; and maintain the voltage regulated signal from the second stage circuitry during the off state of the first stage circuitry.

In another example, the low voltage reference is a bandgap reference.

In another example, the voltage regulated signal and the high voltage reference signal are at unity gain.

In another example, the circuitry is further configured to:
switch the first stage circuitry to an on state;
regenerate the high voltage reference from the low voltage reference;
resend the high voltage reference to the second stage circuitry; and
switch the first stage circuitry to an off state.

In another example, the voltage regulated signal is maintained from the second stage circuitry for the duration of the off state of the first stage circuitry.

In another example, the first stage circuitry further comprises:
a primary operational amplifier (op-amp) having a primary non-inverting input, a primary inverting input, and a primary output;
feedback circuitry coupled across the primary output and the primary inverting input;
voltage reference input circuitry coupled to the primary non-inverting input;
a secondary op-amp having a secondary non-inverting input, a secondary inverting input, and a secondary output, wherein the primary output is coupled to the secondary inverting input; and
high resistance feedback circuitry coupled across the secondary output and the secondary inverting input; and
the second stage circuitry further comprises:
a tertiary op-amp having a tertiary non-inverting input, a tertiary inverting input, and a tertiary output, wherein the secondary output is coupled to the tertiary non-inverting input; and
low resistance feedback circuitry coupled across the tertiary output and the tertiary inverting input.

In another example, the primary output is coupled to the secondary inverting input with high resistance circuitry.

In another example, the first stage circuitry further comprises:
a first operational amplifier (op-amp) having a first non-inverting input, a first inverting input, and a first output;
high resistance feedback circuitry coupled across the first output and the first inverting input;
voltage reference input circuitry coupled to the first non-inverting input; and
wherein the second stage circuitry further comprises:
a second op-amp having a second non-inverting input, a second inverting input, and a second output, wherein the first output is coupled to the second non-inverting input; and
low resistance feedback circuitry coupled across the second output and the second inverting input.

In another example, an apparatus of a memory device for providing a low-power high-performance voltage regulated reference signal to the memory device is provided, comprising circuitry configured to:
receive a bandgap reference at a first stage circuitry;
generate a high voltage reference from the bandgap reference;
send the high voltage reference to a second stage circuitry;
output a voltage regulated signal from the second stage circuitry to the memory device;
switch the first stage circuitry to an off state; and
maintain the voltage regulated signal from the second stage circuitry during the off state of the first stage circuitry.

In another example, the first stage circuitry further comprises:
a primary operational amplifier (op-amp) having a primary non-inverting input, a primary inverting input, and a primary output;
feedback circuitry coupled across the primary output and the primary inverting input;
voltage reference input circuitry coupled to the primary non-inverting input;
a secondary op-amp having a secondary non-inverting input, a secondary inverting input, and a secondary output, wherein the primary output is coupled to the secondary inverting input; and
high resistance feedback circuitry coupled across the secondary output and the secondary inverting input; and
the second stage circuitry further comprises:
a tertiary op-amp having a tertiary non-inverting input, a tertiary inverting input, and a tertiary output, wherein the secondary output is coupled to the tertiary non-inverting input; and
low resistance feedback circuitry coupled across the tertiary output and the tertiary inverting input.

In another example, the primary output is coupled to the secondary inverting input with high resistance circuitry.

In another example, the first stage circuitry further comprises:
a first operational amplifier (op-amp) having a first non-inverting input, a first inverting input, and a first output;
high resistance feedback circuitry coupled across the first output and the first inverting input;
voltage reference input circuitry coupled to the first non-inverting input; and
wherein the second stage circuitry further comprises:
a second op-amp having a second non-inverting input, a second inverting input, and a second output, wherein the first output is coupled to the second non-inverting input; and
low resistance feedback circuitry coupled across the second output and the second inverting input.

In another example, the voltage regulated signal and the high voltage reference signal are at unity gain.

In another example, the circuitry is further configured to:
switch the first stage circuitry to an on state;
regenerate the high voltage reference from the bandgap reference;
resend the high voltage reference to the second stage circuitry; and
switch the first stage circuitry to the off state.

In another example, the circuitry is further configured to:
wait for resend to complete; and
decouple the first stage circuitry from the second stage circuitry.

In another example, the voltage regulated signal is maintained from the second stage circuitry for the duration of the off state of the first stage circuitry.

In another example, the memory device includes phase change memory.

In another example, a method of generating a low-power high-performance voltage regulated signal from a voltage regulator circuit is provided, comprising:
  receiving a low voltage reference at a first stage circuitry;
  generating a high voltage reference from the low voltage reference;
  sending the high voltage reference to a second stage circuitry;
  generating a voltage regulated signal in the second stage circuitry;
  switching the first stage circuitry to an off state; and
  maintaining the voltage regulated signal from the second stage circuitry.

In another example, the voltage regulated signal is a unity gain voltage regulated signal.

In another example, method further includes:
  switching the first stage circuitry to an on state;
  regenerating the high voltage reference from the low voltage reference;
  resending the high voltage reference to the second stage circuitry; and
  switching the first stage circuitry to the off state.

In another example, the voltage regulated signal is maintained from the second stage circuitry for the duration of the off state of the first stage circuitry.

In another example, a non-transitory machine readable storage medium is provided having instructions embodied thereon for generating a low-power high-performance voltage regulated signal, the instructions when executed perform the following:
  receiving, using a first stage circuitry, a low voltage reference;
  generating, using the first stage circuitry, a high voltage reference from the low voltage reference;
  sending, to a second stage circuitry, the high voltage reference;
  generating, using the second stage circuitry, a voltage regulated signal;
  switching the first stage circuitry to an off state; and
  maintaining the voltage regulated signal from the second stage circuitry during the off state of the first stage circuitry.

In another example, the voltage regulated signal is a unity gain voltage regulated signal.

In another example, instructions are provided that when executed perform the following:
  switching the first stage circuitry to an on state;
  regenerating, using the first stage circuitry, the high voltage reference from the low voltage reference;
  resending, to the second stage circuitry, the high voltage reference; and
  switching the first stage circuitry to the off state.

In another example, the voltage regulated signal is maintained from the second stage circuitry for the duration of the off state of the first stage circuitry.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. An apparatus comprising:
  first stage circuitry configured to generate a high voltage output from a low voltage input during an on-time and placed in a low power or off state during an off-time of the first stage circuitry;
  second stage circuitry coupled to the first stage circuitry, the second stage circuitry configured to receive the high voltage output during a sampling time coinciding with the on-time of the first stage circuitry, and output a regulated signal based on the received high voltage input,
  wherein the first stage circuitry includes:
    a first operational amplifier (op-amp) having a first non-inverting input, a first inverting input, and a first output, wherein the first op-amp is enabled to generate the high voltage output from the low voltage input during the on-time;
    high resistance feedback circuitry coupled across the first output and the first inverting input; and
    the low voltage input received through the first non-inverting input; and
  wherein the second stage circuitry includes:
    a second op-amp having a second non-inverting input, a second inverting input, and a second output; and
    a low resistance feedback loop coupled across the second output and the second inverting input, the low resistance feedback loop including no active circuitry;
  and
  a switch coupling the first output to the second non-inverting input to provide the high voltage output to the second op-amp during the on-time.

2. The apparatus of claim 1, the second stage circuitry comprise a unity gain buffer.

3. The apparatus of claim 1, wherein the first stage circuitry includes a voltage reference input coupled to a voltage reference source to receive the low voltage input through the first non-inverting input.

4. The apparatus of claim 3, wherein the voltage reference source is a bandgap reference source.

5. The apparatus of claim 1, wherein the apparatus is resident on a memory device that includes phase change memory cells, the regulated signal output to at least a portion of the phase change memory cells.

6. An apparatus comprising:
  first stage circuitry configured to generate a high voltage output from a low voltage input during an on-time and placed in a low power or off state during an off-time of the first stage circuitry;
  second stage circuitry coupled to the first stage circuitry, the second stage circuitry configured to receive the high voltage output during a sampling time coinciding with the on-time of the first stage circuitry, and output a regulated signal based on the received high voltage output,
  wherein the first stage circuitry includes:
    a primary operational amplifier (op-amp) having a primary non-inverting input, a primary inverting input, and a primary output;
    feedback circuitry coupled across the primary output and the primary inverting input;
    the low voltage input received through the primary non-inverting input;
    a secondary op-amp having a secondary non-inverting input, a secondary inverting input, and a secondary output, the primary output is coupled to the secondary inverting input, and the primary op-amp and secondary op-amp are enabled to generate the high voltage output from the low voltage input during the on-time; and
    high resistance feedback circuitry coupled across the secondary output and the secondary inverting input;

wherein the second stage circuitry includes:
    a tertiary op-amp having a tertiary non-inverting input, a tertiary inverting input, and a tertiary output; and
    a low resistance feedback loop coupled across the tertiary output and the tertiary inverting input, the low resistance feedback loop including no active circuitry;
and
a switch to couple the secondary output to the tertiary non-inverting input to provide the high voltage output to the tertiary op-amp during the on-time.

7. The apparatus of claim 6, wherein the primary output is coupled to the secondary inverting input with high resistance circuitry.

8. The apparatus of claim 6, wherein the first stage circuitry includes a voltage reference input coupled to a voltage reference source to receive the low voltage input through the primary non-inverting input.

9. The apparatus of claim 8, wherein the voltage reference source is a negative reference source.

10. The apparatus of claim 6, wherein the second stage circuitry is a unity gain buffer.

11. The apparatus of claim 6, wherein the apparatus is resident on a memory device that includes phase change memory cells, the regulated signal output to at least a portion of the phase change memory cells.

12. A method comprising:
receiving a low voltage input at a first stage circuitry;
switching the first stage circuitry to an on state and generating a high voltage output from the low voltage input during the on state;
sending the high voltage output to a second stage circuitry during a sampling time period coinciding with the on state of the first stage circuitry;
generating a regulated signal based on the high voltage output in the second stage circuitry;
outputting the regulated signal from the second stage circuitry;
switching the first stage circuitry to an off state; and
maintaining output of the regulated signal from the second stage circuitry while the first stage circuitry is in the off state,
the first stage circuitry including:
    a primary operational amplifier (op-amp) having a primary non-inverting input, a primary inverting input, and a primary output;
    feedback circuitry coupled across the primary output and the primary inverting input;
    the low voltage input received through the primary non-inverting input;
    a secondary op-amp having a secondary non-inverting input, a secondary inverting input, and a secondary output, the primary output is coupled to the secondary inverting input, and the primary op-amp and secondary op-amp are enabled to generate the high voltage output from the low voltage input during the on state; and
    high resistance feedback circuitry coupled across the secondary output and the secondary inverting input;
the second stage circuitry including:
    a tertiary op-amp having a tertiary non-inverting input, a tertiary inverting input, and a tertiary output; and
    low resistance feedback loop coupled across the tertiary output and the tertiary inverting input, the low resistance feedback loop including no active circuitry;
wherein a switch couples the first stage circuitry to the second stage circuitry to provide the high voltage output to the second stage circuitry during the sampling time period coinciding with the on state of the first stage circuitry.

13. The method of claim 12, wherein the regulated signal based on the high voltage output is a unity gain regulated signal.

14. The method of claim 12, further comprising periodically repeating the on state and off state of the first stage circuitry.

15. The method of claim 14, maintaining output of the regulated signal from the second stage circuitry comprises maintaining output of the regulated signal from the second stage circuitry during the off state of the first stage circuitry.

16. A method comprising:
receiving a low voltage input at a first stage circuitry;
switching the first stage circuitry to an on state and generating a high voltage output from the low voltage input during the on state;
sending the high voltage output to a second stage circuitry during a sampling time period coinciding with the on state of the first stage circuitry;
generating a regulated signal based on the high voltage output in the second stage circuitry;
outputting the regulated signal from the second stage circuitry;
switching the first stage circuitry to an off state; and
maintaining output of the regulated signal from the second stage circuitry while the first stage circuitry is in the off state,
the first stage circuitry including:
    a first operational amplifier (op-amp) having a first non-inverting input, a first inverting input, and a first output wherein the first op-amp is enabled to generate the high voltage output from the low voltage input during the on state;
    high resistance feedback circuitry coupled across the first non-inverting input; and
    the low voltage input received through the first non-inverting input;
the second stage circuitry including:
    a second op-amp having a second non-inverting input, a second inverting input, and a second output; and
    a low resistance feedback loop coupled across the second output and the second inverting input, the low resistance feedback loop including no active circuitry;
wherein a switch couples the first stage circuitry to the second stage circuitry to provide the high voltage output to the second stage circuitry during the sampling time period coinciding with the on state of the first stage circuitry.

17. The method of claim 16, wherein the regulated signal based on the high voltage output is a unity gain regulated signal.

18. The method of claim 16, further comprising periodically repeating the on state and off state of the first stage circuitry.

19. The method of claim 18, maintaining output of the regulated signal from the second stage circuitry comprises maintaining output of the regulated signal from the second stage circuitry during the off state of the first stage circuitry.

* * * * *